United States Patent [19]
Shibib

[11] Patent Number: 5,541,429
[45] Date of Patent: Jul. 30, 1996

[54] HIGH VOLTAGE SEMICONDUCTOR DEVICE HAVING IMPROVED ELECTRICAL RUGGEDNESS AND REDUCED CELL PITCH

[75] Inventor: Muhammed A. Shibib, Wyomissing Hills, Pa.

[73] Assignee: AT&T Corp., Murray Hill, N.J.

[21] Appl. No.: 495,292

[22] Filed: Jun. 27, 1995

Related U.S. Application Data

[63] Continuation of Ser. No. 174,941, Dec. 28, 1993, abandoned.

[51] Int. Cl.$^6$ ............................. H01L 33/00; H01L 29/78
[52] U.S. Cl. .......................... 257/329; 257/328; 257/339
[58] Field of Search .................................. 257/328, 329, 257/139, 331, 339, 341, 906

[56] References Cited

U.S. PATENT DOCUMENTS

| | | | |
|---|---|---|---|
| 4,587,713 | 5/1986 | Goodman et al. | 29/576 B |
| 4,639,754 | 1/1987 | Wheatley, Jr. et al. | 357/23.4 |
| 4,810,665 | 3/1989 | Chang et al. | 437/30 |
| 4,879,254 | 11/1989 | Tauzki et al. | 437/41 |
| 5,045,901 | 9/1991 | Komori et al. | 357/23.4 |
| 5,136,349 | 8/1992 | Yilmaz et al. | 257/339 |
| 5,182,222 | 1/1993 | Malhi et al. | 437/41 |
| 5,192,989 | 3/1993 | Matsushita et al. | 257/342 |
| 5,208,471 | 5/1993 | Mori et al. | 257/328 |

FOREIGN PATENT DOCUMENTS

| | | | |
|---|---|---|---|
| 0217266A2 | 4/1987 | European Pat. Off. | H01L 29/06 |
| 0252236A3 | 1/1988 | European Pat. Off. | H01L 29/78 |
| 0405138A3 | 1/1991 | European Pat. Off. | H01L 29/72 |
| 0405138A2 | 1/1991 | European Pat. Off. | H01L 29/72 |

OTHER PUBLICATIONS

Nakagawa et al., Safe Operating Area for 1200–V Non-latchup Bipolar Mode MOSFET's, IEEE Transactions on Electron Devices, vol. ED–34, No. 2, Feb., 1987, pp. 351–355.

*Primary Examiner*—Stephen D. Meier

[57] ABSTRACT

A high voltage semiconductor device having improved electrical raggedness and reduced cell pitch wherein, for an N− channel device, the P+ region (22') extends to the gate contact (28) and wherein the P+ region and the N+ source region (20') overlap efficiently so that the depth of the overlap portion (24') is at least as deep as the N+ source region (20').

6 Claims, 4 Drawing Sheets

000000000000000000000000000000# HIGH VOLTAGE SEMICONDUCTOR DEVICE HAVING IMPROVED ELECTRICAL RUGGEDNESS AND REDUCED CELL PITCH

This is a continuation of application Ser. No. 08/174,941, filed Dec. 28, 1993, now abandoned.

BACKGROUND OF THE INVENTION

I. Field of the Invention

This invention relates generally to high voltage semiconductor devices. More particularly the present invention relates to MOSFET type semiconductor devices having reduced cell pitch and increased electrical ruggedness against activating the inherent parasitic bipolar junctions in the device. Most particularly, this invention pertains to a double diffused metal oxide semiconductor (DMOS) and an insulated gate bipolar transistor (IGBT) having an increased ruggedness against inherent parasitic bipolar effects and having a reduced cell pitch. In addition, the present invention pertains to a method of manufacturing DMOS and IGBT devices having increased electrical ruggedness and reduced cell pitch.

II. Background Art

Several types of designs for semiconductor devices having regions of alternate conductivity, such as MOSFETs, DMOSs and IGBTs, exist. These devices, simply by their construction, possess undesirable bipolar effects which may be triggered when operated at certain conditions as a result of the parasitic NPN (or PNP) junctions of the device. Thus, when the devices are operated at high voltages, should the parasitic NPN (or PNP) junctions be activated, the devices will enter breakdown mode, thereby causing unwanted current flow and possible destruction.

Several patents exist which disclose techniques to make each semiconductor device more rugged against the activation of the parasitic NPN (or PNP) junctions. In other words, these patents discuss increasing the safe operation area of the device before the parasitic bipolar effects are triggered so that the device will remain in its off state at higher voltages. For example, U.S. Pat. No. 4,810,665 (Chang et al.) discloses a method of making a rugged MOSFET which has a deeply diffused P+ region (diffused into a major surface) located in the center of a ring shaped N+ source region (for an N-channel device). The central P+ region shorts out the emitter and base regions (the source and body, respectively) of the parasitic NPN of the device, thereby allowing the device to be operated at higher voltages. In addition, the source contact is in conductive relation with both the N+ and P+ regions on the major surface of the device so that the emitter and base regions are also shorted on the major surface.

Among the causes of absence of ruggedness in N-channel MOSFET devices is the appearance of holes in the vicinity of the lower potential source contact when the device is operated at high voltages. The Chang et al. patent, for example, makes no provision for the removal of such holes from the lower potential source contact. In addition, the need for the deeply diffused P+ region limits the amount the cell pitch of the device can be reduced because the lateral diffusion resulting from the deeply diffused P+ region extends into the active area of the device, thereby degrading the device characteristics.

U.S. Pat. No. 4,587,713 (Goodman et al.) discloses a MOSFET device having improved electrical ruggedness against parasitic bipolar effects. The Goodman et al. device, like Chang et al., also incorporates a ring-shaped source region but, utilizes a supplementary region which, in effect, shorts out the base and emitter regions of the parasitic NPN (or PNP). However, the supplementary region is difficult to construct and thus makes this device impractical to manufacture. In addition, this device, like Chang et al., does not provide a way of removing generated holes from the source contact without traversing an area under the emitter which can create a sufficient voltage drop to forward bias the emitter-base junction of the parasitic NPN, thereby activating the parasitic NPN and degrading the device by causing current to flow when the device is in its off state. It is, therefore, desirable to have a semiconductor device having a reduced cell pitch while still maintaining electrical ruggedness against activating the parasitic bipolar effects.

Accordingly, it is an object of this invention to provide a semiconductor device such as a DMOS or IGBT having a reduced cell pitch without degrading the on-characteristics of the device and with increasing the electrical ruggedness against parasitic bipolar effects.

It is a further object of the present invention to provide a method for manufacturing a rugged reduced cell pitch DMOS or IGBT.

Other objects of the present invention will become apparent as the following description proceeds.

The foregoing as well as additional details of the present invention will become apparent from the following detailed description and annexed drawings of the presently preferred embodiment thereof.

SUMMARY OF THE INVENTION

The present invention relates to a high voltage semiconductor device having improved ruggedness and reduced cell pitch. The device comprises a semiconductor substrate of a first electrical conductivity type having a first doping concentration, a first conducting material in conductive relation with the substrate, a bulk region of semiconductor material having the first electrical conductivity type and a doping concentration less than the first doping concentration, the bulk region being disposed on the substrate and defining a major surface, a second conducting material disposed on the major surface and defining an opening therein, and a first impurity region of a second electrical conductivity type having a second doping concentration formed in the bulk region, wherein the first impurity region has a channel portion extending to the major surface with the channel portion being disposed outside the opening and in conducting relation with the second conducting material. The device further comprises a second impurity region of the second electrical conductivity type having a doping concentration greater than the second doping concentration and formed in the first impurity region, the second impurity region having a predetermined depth and a surface area on the major surface, a third impurity region formed in the first impurity region and having the first electrical conductivity type with a predetermined depth and doping concentration greater than the doping concentration of the bulk region, the second and third impurity regions each having a portion in contact with the channel portion of the first impurity region, an insulating material disposed on the first conducting material, and a third conducting material disposed on the insulating material and in conductive relation with the second and third impurity regions.

The present invention also relates to a method of manufacturing a high voltage semiconductor device having improved ruggedness and reduced cell pitch. The method comprises the steps of (1) disposing on a semiconductor substrate of a first electrical conductivity type having a first doping concentration and an upper surface and a lower surface, a first conducting material in conductive relation with said lower surface, (2) disposing on the upper surface of the substrate, a bulk region of the first electrical conductivity type and a doping concentration less than the first doping concentration, the bulk region defining a major surface, (3) disposing on the major surface, a second conducting material, (4) creating a window opening in the second conducting material, (5) forming in the bulk region, through the window opening, a first impurity region of a second electrical conductivity type having a second doping concentration, the first impurity region having a channel portion extending to the major surface, the channel portion being disposed outside the opening and in conducting relation with the second conducting material, (6) forming in the first impurity region, a second impurity region of the second electrical conductivity type and a doping concentration greater than the second doping concentration, the second impurity region having a predetermined depth and a surface area on the major surface, so that a portion of the second impurity region is in contact with the channel portion of the first impurity region, (7) forming in the first impurity region, a third impurity region having the first electrical conductivity type and a predetermined depth and a doping concentration greater than the doping concentration of the bulk region, so that a portion of the third impurity region is in contact with the channel portion of the first impurity region, (8) disposing an insulating material on the first conducting material, and (9) disposing a third conducting material on the insulating material and in conductive relation with the second and third impurity regions.

In the preferred embodiment, the depth of the third impurity region is at least as deep as the depth of the second impurity region.

DETAILED DESCRIPTION OF THE PREFERRED EMBODIMENT

Figure 1:
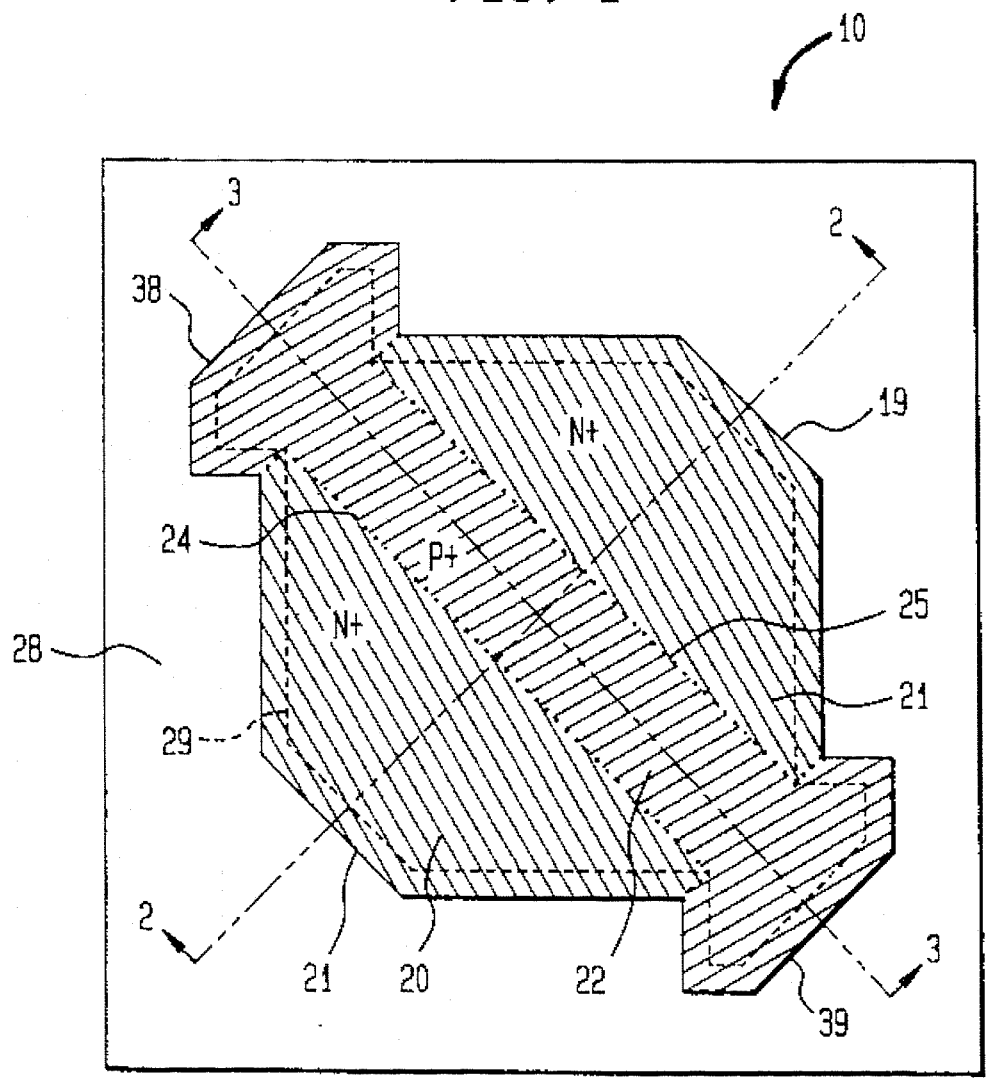
FIG. 1 is a top plan view of a preferred DMOS design of the present invention with the source contact and oxide layers removed.
Figure 2:
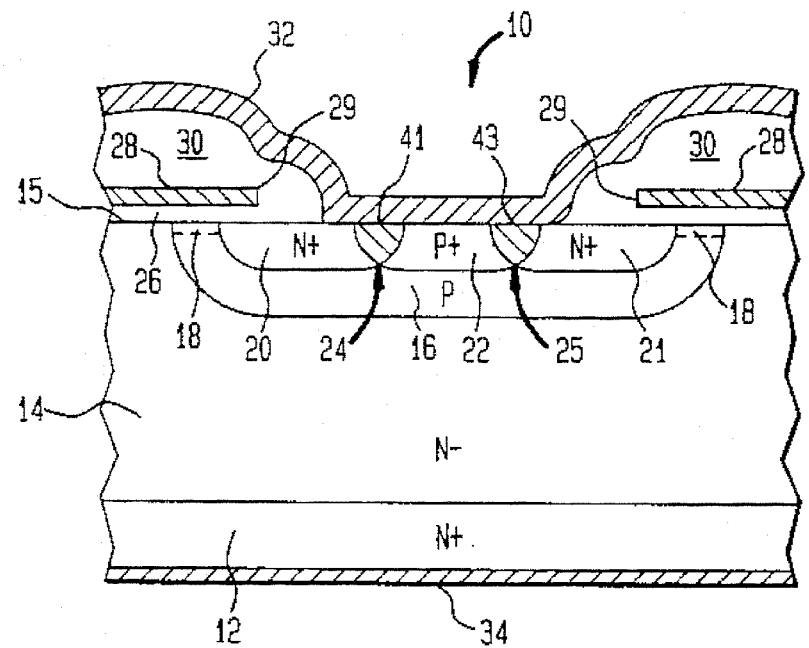
FIG. 2 is a cross-sectional view taken along the line 2—2 of FIG. 1, with the source contact and oxide layers included.
Figure 3:
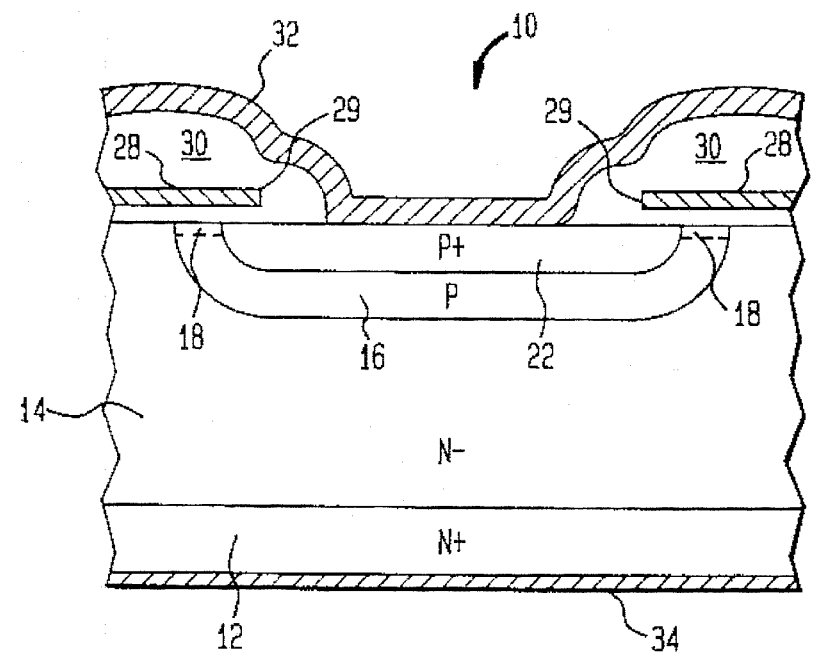
FIG. 3 is a cross-sectional view taken along the line 3—3 of FIG. 1, with the source contact and oxide layers included.

Referring now to the drawings in detail, and initially to FIGS. 1–3, an N-channel DMOS device 10 having a preferred construction in accordance with the present invention is shown. As shown, a first impurity P+ region 22 has a portion directly in conducting relation with a gate contact 28. In the preferred embodiment, the P+ region 22 comprises a central elongate portion (defined by the dotted lines 24, 25 in FIG. 1) and enlarged portions at both ends thereof (defined by the solid lines 38, 39 on the ends of the elongated portion). Thus, in the preferred embodiment, an N+ source 20 is divided into two regions 20, 21 with region 20 extending from dotted line 24 away from the P+ region 22 to the solid line 21 and region 21 extending from dotted line 25 away from the P+ region 22 to the sold line 19 (FIG. 1).

Referring now to FIG. 2, the device 10 comprises an N+ substrate 12 having an upper surface and a lower surface, with a first conducting material or drain contact 34 disposed on the lower surface. A bulk region 14 of N– silicon material is formed on the substrate 12, thereby creating a major surface 15 upon which a gate insulation layer 26 is formed. A second conducting layer or gate contact 28 is disposed on gate oxide 26 and a window is formed therein having inner edges 29 (shown as the dashed line in FIG. 1). A first impurity region or body comprised of P silicon material 16 is formed in bulk region 14 through the window and the third and fourth impurity regions which comprise source regions 20, 21, which are shown overlapping the first impurity P+ region 22 are formed therein. As shown, a channel portion 18 is created along major surface 15 and below gate contact 28.

Still referring to FIG. 2, overlap regions 24, 25, which correspond to the dotted lines in FIG. 1, extend both along major surface 15 and vertically into body 16. Thus, as shown, the overlap regions bounded by lines 24 and 25, extend vertically downward from major surface 15 into body region 16 to a depth at least equal to the depth of the two source regions 20, 21. This configuration results in a two-fold benefit. Firstly, it reduces the cell pitch by an amount equal to the extended overlap regions 24, 25 on the major surface 15. Secondly, the increased overlap regions 24, 25 create a more efficient shorting of the emitter-base junction of the parasitic NPN of the device. Thus, the electrical raggedness of the device is increased. In addition, due to the increased overlap regions 24 and 25, which extend to major surface 15, the overall cell pitch of the device is reduced by the amount of increased surface area of the laterally diffused areas 24, 25.

As stated above, and with reference now to FIGS. 1 and 3, the P+ region 22 comprises an elongated portion and enlarged portions. The enlarged portions of the P+ region extend beyond the inner edge 29 of the gate contact 28 (shown as a dashed line in FIG. 1). This extension of the P+ region 22 in a direction toward gate contact 28 provides a path of least resistance for the holes generated in the device during the off-state which, in the absence of this extended region, would accumulate under source regions 20, 21 and activate the parasitic NPN of the device. Thus, this configuration of the P+ region 22 allows the generated holes to travel away from the lower potential source regions 20, 21 to the gate contact 28, thereby removing the generated holes from below source regions 20, 21 and further increasing the electrical ruggedness of the device 10.

The electrical raggedness of the device of the present invention is further increased over that of the prior art because, as shown in FIG. 2, a greater portion of the surface area of the source regions 20, 21 and the P+ region 22 which are present on major surface 15 are in contact with source contact 32. Thus, the parasitic emitter-base junction along major surface 15 is more efficiently shorted relative to the prior art.

Figure 4:
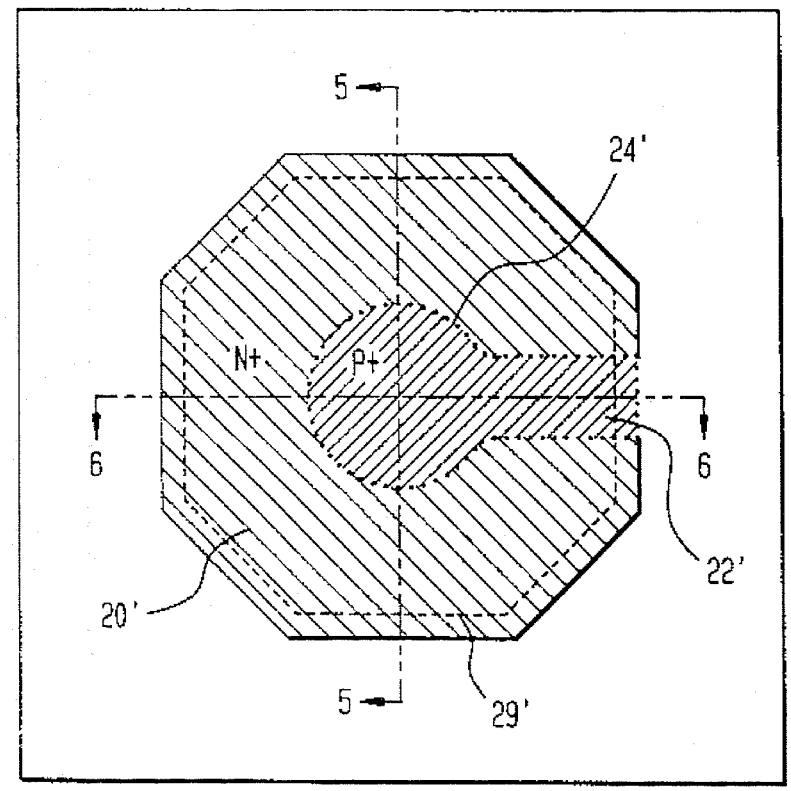
FIG. 4 is a top plan view of an alternate design of a DMOS in accordance with the present invention with the source contact and oxide layers removed.
Figure 5:
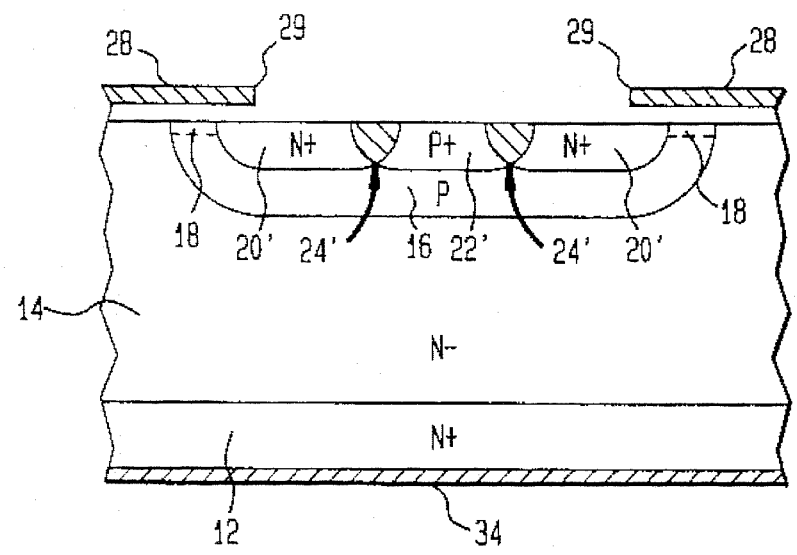
FIG. 5 is a cross-sectional view taken along the line 5—5 of FIG. 4, with the source contact and oxide layers included.
Figure 6:
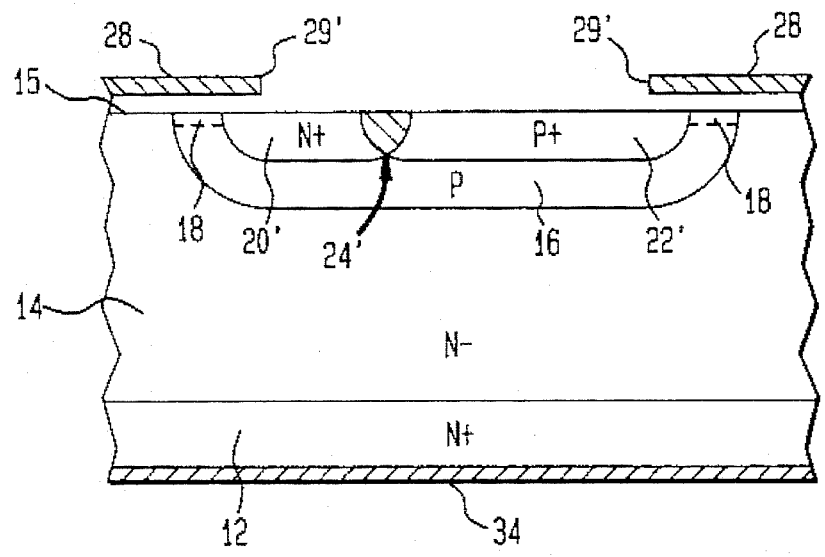
FIG. 6 is a cross-sectional view taken along the line 6—6 of FIG. 4, with the source contact and oxide layers included.

Turning now to FIGS. 4–6, an alternate embodiment of the present invention is shown. As shown, the N+ source region 20' is "C" shaped and partially surrounds a keyhole shaped P+ region 22'. Thus, the P+ region 22', like the P+ region 22 of FIG. 1, provides a path in which the generated holes are led away from the source region 20' and deposited at the source contact 10 which is shown in FIG. 3. The cross-sectional views of the embodiment of FIG. 4 are shown in FIGS. 5 and 6, wherein the P+ region 22' is again shown extending to gate contact 28 and overlap regions 24' are at least as deep as source region 20'.

Figure 7:
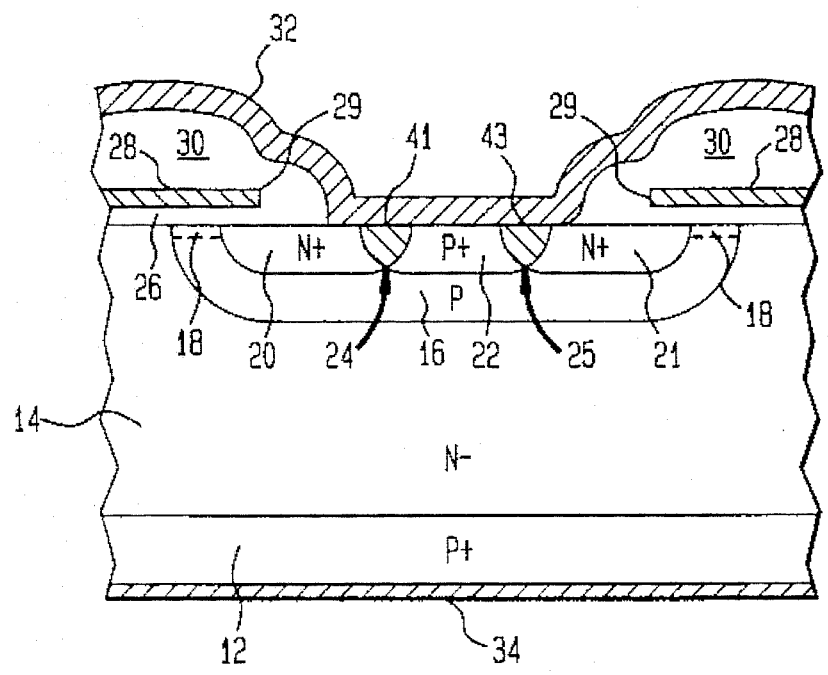
FIG. 7 is a cross-sectional view of an IGBT in accordance with the present invention, with the source contact and oxide layers included.

Referring now to FIG. 7, a design for an IGBT in accordance with the present invention is shown. The main difference between the IGBT and the device of FIG. 1 is that the N+ substrate 12 is replaced with a P+ substram. In the normal operation of an IGBT device, holes are injected into the N– bulk region 14 by the P+ substram 12. Excess holes can cause the IGBT to latch-up, rendering the device uncontrollable. Thus, especially for an IGBT, it is important that these holes be removed from the source regions 20, 21. The configuration of the P+ region 22 is especially beneficial in improving the characteristics of an IGBT because, by removing the holes, the latching current of the device is increased.

Now that I have shown and described the features of the present invention, a process of fabrication of an N-channel device will now be described. However, as semiconductor fabrication techniques are well known to those having ordinary skill in the art, only a brief description of the process techniques will be given. It should also be noted that while an N-channel device is described hereinbelow, opposite type doping regions may be used to manufacture a P-channel device.

The device 10 is comprised of a heavily doped N+ substrate 12 having an upper and a lower surface with a drain contact 34 disposed along the lower surface, such as, by evaporation techniques. The drain contact 34 is comprised of metal and, is preferably aluminum. Although the drain contact 34 is shown in FIGS. 2, 3 and 5–7 as being on the lower surface of substrate 12, it should be apparent to those of ordinary skill in the art that the drain contact 34 may likewise be extended up to major surface 15. Next, an N– bulk region 14 is grown, preferably by epitaxial growth techniques, so that major surface 15 is formed. An insulation layer of oxide is then grown to a desired thickness which is preferably 1 µm and the insulating material used is preferably $SiO_2$. The oxide layer is then etched away along major surface 15 over the regions where the source and gate will be formed, such that a gate oxide layer 26 results having a preferred thickness in the range of 400 Å to 1000 Å. A second conducting material, which will form the gate contact 28, is then disposed on major surface 15 and a window is formed therein through which a first impurity region, comprising the body region 16 of the device, will be formed. The second conducting material is preferably polycrystalline silicon (polysilicon) material which is doped N+ by using, for example, phosphorous, arsenic or any like elements as a dopant. The gate contact has a preferable thickness of 0.5 µm.

The window is formed in gate contact 28 as by plasma etching techniques, as is known to those of ordinary skill in the art, so that the window shape of FIG. 1 or FIG. 4 or, for that matter, any other shape which will accomplish the invention, is formed having a boundary defined by inner edge 29 of gate contact 28. A first impurity region, comprising a P– type body 16, is next diffused through the window opening and the device is then heated in an appropriate manner so that the outer edge of the body 16 spreads out along surface area 15 to a position below gate contact 28, which will become the channel portion 18.

Referring to the embodiment of FIG. 1, the window is then masked, preferably by utilizing photoresist techniques, in an appropriate manner along the dotted line (shown as 24) so that the elongated P+ region 22 is exposed and the remaining window area is blocked by the mask. The boundary of the mask on major surface 15 is show as 41 and 43 in FIG. 2. The P+region 22 is then implanted in a manner known by those having ordinary skill in the art, such as by using a high concentration of boron or any similar element as a dopant. Next, the photoresist mask is removed and another photoresist mask is used for implanting the N+ source regions 20, 21.

To achieve the efficient shorting of the parasitic base-emitter junction in the device, the photoresist mask used to shield the already formed P+ region 22 from the N+source diffusion is essentially the converse of the mask used to shield the N+ source regions 20, 21 from the P+ diffusion. In other words, the P+ photoresist mask and the N+ photoresist mask both have their respective boundaries along the two dotted lines 24, 25 in FIG. 1, one permitting diffusion in the P+ region 22 while preventing diffusion in regions 20, 21, and the other preventing diffusion in region 22 while permitting diffusion in regions 20, 21. This masking configuration of the P+ region 22 and the N+ source regions 20, 21 allows for the lateral diffused areas to overlap as at areas 24–25 in the desired manner as shown in FIG. 2.

Once the source N+ regions 20, 21 are formed, insulating material 30 is disposed over polysilicon gate contact 28. The insulating material 30 which is preferably $SiO_2$, is then etched away to expose the window area. A third conducting material 32, which functions as the source contact, is then deposited over the exposed window area in conductive relation with the N+ source regions 20, 21 and the P+ region 22. The conducting material is preferably metal and most preferably aluminum. Lastly, a protective layer, preferably comprised of plasma nitrite, is deposited over the device.

Although I have herein shown and described the presently preferred embodiment of the invention, various changes and modifications will be readily apparent to those of ordinary skill in the art who read the foregoing description. In addition, it should be noted that opposite conductivity semiconductor devices can be constructed by simply interchanging the P doped silicon regions with N doped silicon regions. In addition, other configurations of the P+ region 22 and N+ source regions 20, 21 may be contemplated and would still fall within the scope of the present invention. Thus, the preferred embodiment and examples described herein are for illustrative purposes only and are not to be construed as limiting the scope of the present invention which is properly delineated only in the appended claims.

I claim:

1. A high voltage semiconductor device having improved ruggedness and reduced cell pitch, comprising:

a semiconductor substrate of a first electrical conductivity type having a first doping concentration;

a first conducting material in conductive relation with said substrate;

a bulk region of semiconductor material of a first electrical conductivity type and having a doping concentration less than said first doping concentration, said bulk region being disposed on said substrate and defining a major surface;

a second conducting material disposed on said major surface and defining an opening therein;

a first impurity region of a second electrical conductivity type having a second doping concentration formed in said bulk region, said first impurity region having a first predetermined depth and a channel portion extending to said major surface, said channel portion being disposed outside said opening and in conducting relation with said second conducting material;

a second impurity region of said second electrical conductivity type and having a doping concentration greater than said second doping concentration, said second impurity region being formed in said first impurity region and isolated from said bulk region by said first impurity region, said second impurity region having a second predetermined depth less than said first predetermined depth and a surface area on said major surface defining a second impurity region outer boundary;

a third impurity region formed in said first impurity region, said third impurity region being of said first electrical conductivity type and having a third predetermined depth less than said first predetermined depth, said third impurity region having a doping concentration greater than said doping concentration of said bulk region and a surface area on said major surface defining a third impurity region outer boundary, a portion of said third impurity region being in direct physical contact with said channel portion;

said second impurity region having a distal portion in direct physical contact with said channel portion and a proximal portion in direct physical contact with said third impurity region and, wherein a portion of said outer boundary of said second impurity region defines an edge of said distal portion, said edge extending on said major surface beyond said boundary of said third impurity region;

an insulating material disposed on said first conducting material; and a third conducting material disposed on said insulating material and in conductive relation with said second and third impurity regions.

2. The device of claim 1, wherein said proximal portion of said second impurity region includes an enlarged portion disposed in direct physical contact with said channel portion.

3. A high voltage semiconductor device having improved ruggedness and reduced cell pitch, comprising:

a semiconductor substrate of a first electrical conductivity type having a first doping concentration;

a first conducting material in conductive relation with said substrate;

a bulk region of semiconductor material of a first electrical conductivity type and having a doping concentration less than said first doping concentration, said bulk region being disposed on said substrate and defining a major surface;

a second conducting material disposed on said major surface and defining an opening therein;

a first impurity region of a second electrical conductivity type having a second doping concentration formed in said bulk region, said first impurity region having a first predetermined depth and a channel portion extending to said major surface, said channel portion being disposed outside said opening and in conducting relation with said second conducting material;

a second impurity region of said second electrical conductivity type having a doping concentration greater than said second doping concentration, said second impurity region being formed in said first impurity region and isolated from said bulk region by said first impurity region, said second impurity region having a second predetermined depth less than said first predetermined depth, a surface area on said major surface defining a second impurity region outer boundary, a distal portion in direct physical contact with said channel portion, and a proximal portion;

third and fourth impurity regions formed in said first impurity region on either side of said second impurity region and in direct physical contact and in conducting relation with said proximal portion of said second impurity region, said third and fourth impurity regions being of said first electrical conductivity type, each having a predetermined depth less than said first predetermined depth, a doping concentration greater than said doping concentration of said bulk region, a portion in direct physical contact with said channel portion, and surface areas on said major surface defining third and fourth impurity region outer boundaries;

wherein a portion of said outer boundary of said second impurity region defines an edge of said distal portion, said edge extending on said major surface beyond said boundaries of said third and said fourth impurity regions;

an insulating material disposed on said second conducting material; and a third conducting material disposed on said insulating material and in conductive relation with said second, third and fourth impurity regions.

4. The device of claim 3, wherein said proximal portion of said second impurity region includes a central, elongate portion and wherein said third and fourth impurity regions are disposed on either side of said central, elongate portion.

5. The device of claim 4, wherein said proximal portion of said second impurity region includes an enlarged portion disposed at one end of said central, elongate portion and in direct physical contact with said channel portion.

6. The device of claim 5, wherein said enlarged portion comprises two enlarged portions, one disposed at one end of said elongated portion and another disposed at another end of said elongated portion.

* * * * *